United States Patent [19]

Burnham et al.

[11] 4,099,999

[45] Jul. 11, 1978

[54] METHOD OF MAKING ETCHED-STRIPED SUBSTRATE PLANAR LASER

[75] Inventors: Robert D. Burnham, Los Altos Hills; Donald R. Scifres, Los Altos, both of Calif.

[73] Assignee: Xerox Corporation, Stamford, Conn.

[21] Appl. No.: 805,661

[22] Filed: Jun. 13, 1977

[51] Int. Cl.² .................. H01L 21/20; H01L 21/74; H01S 3/06
[52] U.S. Cl. ................................ 148/187; 148/175; 331/94.5 H; 357/16; 357/18
[58] Field of Search ................ 357/18; 331/94.5 H; 148/187, 175

[56] References Cited

U.S. PATENT DOCUMENTS

| | | | |
|---|---|---|---|
| 3,824,493 | 7/1974 | Hakki | 331/94.5 H |
| 3,849,790 | 11/1975 | Gottmann et al. | 357/18 |
| 3,920,491 | 11/1975 | Yonezu | 148/175 |
| 3,978,428 | 8/1976 | Burnham et al. | 331/94.5 H |
| 3,984,262 | 10/1976 | Burnham et al. | 148/172 |
| 4,033,796 | 7/1977 | Burnham et al. | 148/175 |

OTHER PUBLICATIONS

T. Tsukada, "GaAs-Ga$_{1-x}$Al$_x$As Buried-Heterostructure Injection Lasers", Jr. Appl. Phys., 45 (1974) 4899.
W. P. Dumke et al., "Room Temp. Laser Array With Buried Diff. Stripes," IBM-TDB, vol. 16 (1973) 1758.
J. C. Marinace et al., "Narrow Junction Lasers," IBM-TDB, vol. 15 (1972) 562.

Primary Examiner—L. Dewayne Rutledge
Assistant Examiner—Upendra Roy
Attorney, Agent, or Firm—James J. Ralabate; Sheldon F. Raizes; Leonard Zalman

[57] ABSTRACT

A method of making a diode laser in which a pump current confining channel is formed on the substrate side of a diode laser prior to growth of the active or recombination region of the diode laser. The current confining channel is formed by providing, by diffusion, a rectifying junction on a substrate surface and then forming, by etching, a narrow channel completely through a central portion of the diffused layer and the rectifying junction. The remaining layers of the diode laser are then successively grown. The portions of the rectifying junction on both sides of the channel are reverse biased when the primary junction of the diode laser is forward biased whereby pump current flow is confined to a path through the channel.

2 Claims, 6 Drawing Figures

METHOD OF MAKING ETCHED-STRIPED SUBSTRATE PLANAR LASER

BACKGROUND OF THE INVENTION

For many practical applications of diode lasers it is desirable to operate the laser in a continuous wave (CW) mode, i.e., at room temperature with a d.c. bias voltage of between about 3 to 6 volts. To achieve CW operation the current density in the active region of the diode laser must reach about 2000 amps/cm$^3$. Such high current density is difficult to achieve when the active (pumped) area of the laser is large resulting in high total current flow and subsequent overheating.

One of the aforementioned practical applications of diode lasers is utilization as a light source in an integrated optical system using fiber optic elements which may be on the order of only 10 microns in diameter. When the active gain region of the laser is large, several filamentary areas lase over the entire active region. Since the active region is larger than the diameter of the fiber optic elements, the fiber optic elements will transmit light from less than all of the filamentary areas. Thus, power is expended to pump filamentary areas which do not contribute to light output. Also, pumping of used and unused filamentary areas necessitates high pumping current which causes heat dissipation problems.

Several attempts have previously been made to decrease the active region of diode lasers by providing pumping current confinement, as taught by U.S. Pat. Nos. 3,849,790 and 3,920,491. These attempts have been focused on modification of the diode laser structure after completion of the growth of that structure. Specifically, it has been attempted to provide a low resistance current channel through the non-substrate side of a diode laser, with the channel extending to within close proximity to the active region and with a high resistance path on both sides of the channel. The low resistance channel, which can be delineated by ion implantation, diffusion and etching techniques, is formed after growth of the diode laser.

Several problems exist with providing current confinement from the non-substrate side of the diode laser after growth of the laser. First, the low resistance channel must be formed through at least two semiconductor regions which can have variable thickness due to process imperfections, thereby making it difficult to bring the channel into close, uniform proximity to the active region without extending into the active region. Also, the width of the channel is hard to control. Thus, threshold current reduction by operating on the non-substrate side of the diode laser after growth of the diode laser fails to provide reliability in device operation. Also, to provide the low resistance channel an additional continuous layer must be formed on the non-substrate side of the diode. This additional layer moves the metallized contact on the non-substrate side of the diode further from the active region which makes the channel long with the possibility of increased resistance. Also, with the metallized contact further removed from the active region, heat dissipation can be a problem.

More recently, U.S. Pat. No. 3,984,262 proposed providing current confinement by means of a low resistance channel on the substrate side of the diode laser. The channel is formed in the device substrate before the growth of the layers that define the active region of the laser thereby avoiding damage to these layers with the resulting increasing in device reliability. Since the channel is formed on the substrate, its width can be closely controlled and a plurality of channels can be formed simultaneously (with many devices formed from one substrate by subsequent dicing). Current confinement can be further reduced, with the attendant advances of lower pumping current, greater heat dissipation, and single filament operation, by forming current confining channels on both sides of the active region.

Preferably, the current confining channel on the n-side of the diode laser is provided by a diffusion process through a polished surface of a substrate which has masking stripes of nitride material thereupon. The diffused areas form p-n junctions with the substrate material with the channel bounded on both sides by these p-n junctions. Following the diffusion, the remaining layers of the laser diode are grown. Current confinement is achieved because the channel in the substrate allows current to flow while the diffused areas do not conduct due to a reverse bias on the p-n junctions associated with the diffused areas.

As noted, the process of U.S. Pat. No. 3,984,262 requires a diffusion mask, for example, of silicon nitride. The requirement of a diffusion mask complicates the process and may lead to defects due to pin holes in the diffusion mask.

OBJECTS OF THE INVENTION

An object of the present invention is to provide an improved method of making a diode laser.

Another object of the present invention is to provide a method of making a diode laser having improved pump current confinement.

A still further object of the present invention is to provide an improved method of making a heterojunction diode laser.

A still further object of the present invention is to provide an improved method of making diode lasers with improved transverse mode control.

A still further object of the present invention is to provide a method of making a diode laser capable of CW mode operation.

SUMMARY OF THE INVENTION

In accordance with the invention, a diode laser having a pump current confining channel is formed by first forming a shallow diffusion into the surface of a substrate to establish a rectifying junction. Then, by conventional photolithographic and etching techniques, a groove is etched through a narrow portion of the diffused layer and beyond the rectifying junction. Following the etching, and removal of any masking material, successive layers of the diode laser are grown.

DESCRIPTION OF THE PREFERRED EMBODIMENT

The invention will be discussed in relation to a double heterojunction diode laser. It is apparent, however, that the improved current confining structure is equally applicable to single heterojunction diode lasers and homostructure diode lasers.

Figure 1:
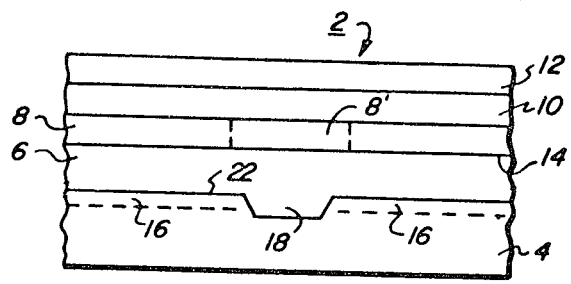
FIG. 1 is a side elevation view of a diode laser produced by the method of the invention.

Referring now to FIG. 1, there is shown double heterojunction diode 2. Diode 2 includes an n-type GaAs substrate 4, an n-type GaAlAs layer 6, a p-type GaAs (active or recombination) layer 8, a p-type GaAlAs layer 10 and a p-type contact-facilitating layer 12.

Due to its base material (GaAs) and doping concentration, the layer 8 has a band gap of approximately 1.4 eV, which is substantially lower than the approximately 1.8 eV band gap of layers 6 and 10. Also, the refractive index of layer 8 is substantially greater (approximately 3.6) than the approximately 3.4 refractive index of layers 6 and 10. As is well known, when a forward bias (a positive voltage to layer 12 and a relatively negative voltage to substrate 4) is applied to the p-n junction 14 electrons are injected from layer 6 into layer 8 and are confined to layer 8 by the potential difference produced by the heterojunction layer 10. With sufficient pump current, population inversion is achieved and gain is obtained with light produced by radioactive recombination of the carriers in layer 8. This light is guided in layer 8 due to its higher refractive index relative to that of layers 6 and 10.

The process to be described provides a channel 18 between p-type GaAs regions 16. Current confinement is achieved by channel 18 (which preferably is on the order of 10 microns wide) because the p-n junctions 22 between substrate 4 and regions 16 are reverse biased (when the diode is forward biased as previously explained), and pumping current is thus confined to a path through n-type channel 18. The laser diode of FIG. 1 provides improvement over devices in which current confinement is confined to the p-type layers of the diode because regions 16 are formed before the layers 6, 8, 10 and 12 are formed.

Figure 2:
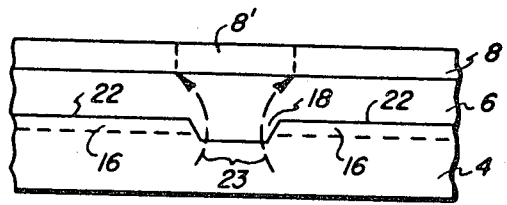
FIG. 2 shows the path of pumping current in a portion of the laser of FIG. 1.

The pumping current confinement of the laser of FIG. 1 is explained in conjunction with FIG. 2 which shows only a portion of the laser of FIG. 1. The segmented arrows 23 in FIG. 2 show the path of pumping current from substrate 4 to layer 8. As noted, current flow is restricted to passage through channel 18 because the p-n junctions 22 are reverse biased when the diode laser is forward biased. Thus, the path of the pumping current is confined and only a small portion of the layer 8 (the active region 8') is pumped. Since the pumped active region is relatively small (believed to be about 20–30 microns wide when channel 18 is about 10 microns wide) compared to the width of the region 8 which conventionally is about 250 microns wide, less pumping current is required to provide the current density (amp/cm$^3$) sufficient to initiate lasing than is needed to provide a similar current density in conventional diode lasers. Accordingly, less heat is produced by the pumping and the diode laser of FIG. 1 can be readily heat sunk to provide CW room temperature operation.

With the active region relatively narrow, fewer (and preferably only one) filamentary areas will lase, providing more efficient operation when the laser is used as a light source in conjunction with thin fiber optic elements. Also, the thinness of the active region substantially restricts laser operation to the lowest order transverse mode since higher order modes do not have sufficient intensity in the active region to provide sufficient coupling for lasing. Also, if the ratio of the thickness of the n-type GaAlAs layer 6 of FIG. 1 above channel 18 to the thickness of the n-type GaAlAs layer above regions 16 is properly designed, laser operation can be restricted substantially to the lowest order transverse mode since higher order modes would leak from the active layer 8 above the diffused regions 16 because of the thinness of layer 6 between layer 8 and regions 16.

As shown by FIG. 2, the segmented arrows 23 (representing current flow) do not spread substantially in layer 6. This confinement is due to the low doping (about 10$^{17}$/cm$^3$) of region 6. Also, region 6 is made thin, about 1.0 micron, to reduce current spreading. There is not much spreading in region 8' since layer 8 is only about 0.3 micron thick. Also, region 6 could be composed of Ga$_{1-x}$Al$_x$As ($x>0.37$) for current confinement although lower Al content will suffice.

As shown by FIG. 1, the device 2 includes only layers 10 and 12 above the active region 8' and no additional layer as is used when current confinement is from the p-side of the diode laser. With only layer 10 and 12 on the p-side, which layers 10 and 12 can have a thickness of about 2 microns and about 2 microns, respectively, the active region 8' can be located close to a heat sink to thereby provide efficient heat dissipation.

Figure 3A:
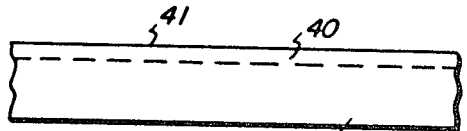
FIGS. 3(a–d) show steps in the method of making the diode laser of FIG. 1.
Figure 3B:
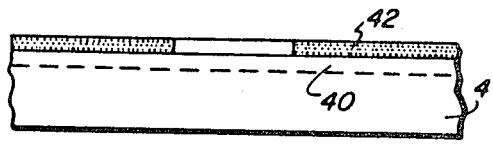

The laser of FIG. 1 is made by a novel process which provides for formation of channel 18 prior to formation of layers 6, 8, 10 and 12. As shown in FIG. 3a, fabrication is initiated by forming, by diffusion, a shallow (0.1–5.0 microns)p-type layer 40 on a smooth, polished surface 41 of an n-type GaAs substrate 4. A portion of this surface may then be removed by chemical etching, ion milling or mechanical polishing. Next, a conventional ultraviolet-sensitive photoresist layer 42, such as, for example, Shipley AZ 1350, is deposited over layer 40, followed by exposure of the resist, as shown in FIG. 3b where the dotted portions of layer 42 have been exposed to ultraviolet light to make those portions insensitive to a reagent such as Shipley developer. The unexposed portions of layer 42 are then removed by immersion of the device of FIG. 3b in a bath of a reagent such as Shipley developer to expose a strip 43 of the surface 41. Preferably, the strip 43 is perpendicular to the <110> cleaved planes of substrate 4.

Figure 3C:
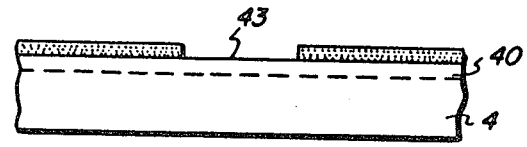
Figure 3D:
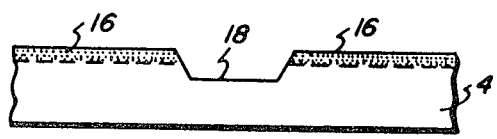

The device of FIG. 3c is placed in a conventional, controlled GaAs etch such as, for example, 120 parts ethylene glycol, 30 parts H$_2$O$_2$, 6 parts H$_3$PO$_4$, 1 part HF, which etches at the rate of about ½ micron a minute a groove or channel 18 in the GaAs substrate 4 where the surface 41 of the substrate 4 is not protected by resist regions 42, to provide the device of FIG. 3d with regions 16 adjacent channel 18. Care should be taken to ensure that the channel 18 extends completely through the diffused layer 40, that is, the bottom of the channel 18 must be completely n-type. After the etching is completed, the photoresist regions 42 are completely removed and the device of FIG. 3d is cleaned, such as by HCl and HF. Layers 6, 8, 10 and 12 are then grown successively on the grooved surface 41 of the substrate 4 to provide the laser of FIG. 1. Layers 6, 8, 10 and 12 are grown in a conventional manner, such as by liquid phase epitaxy or molecular beam epitaxy.

FIG. 1 clearly shows that the first layer grown, that is, layer 6, will completely fill in the etched groove 18 because it is that area of the substrate that best favors nucleation. The shallower the diffusion layer 40, the shallower the etched groove 18 need be and the easier it would be to fill in the groove.

The device of FIG. 1 provides a diode laser in which pump current confinement is achieved on the substrate side of the diode laser. The pump current is restricted to a flow path through the grown-in groove or channel 18 because the diffused regions 16 provide p-n junctions which are reverse biased when the diode laser 2 is forward biased for pumping of the active region 8 of the diode laser. The major advantage of the described process over the process described in U.S. Pat. No. 3,984,262 is that it eliminates the need for a diffusion mask which may have pin hole defects that permit undesirable, localized diffusions.

It should be noted that layer 8 may grow somewhat bowl-shaped depending on the depth of the etched groove or channel 18 and the thickness of layer 6. In this case it has been found that the light output vs. current is more nearly linear than with conventional striped substrate devices formed after LPE growth. This then is a further advantage of this etched striped substrate laser.

The doping level of layers 8, 10 and 12 can vary by quite a large range with levels of $5 \times 10^{16}-10^{18}/cm^3$, $5 \times 10^{17}-10^{19}/cm^3$ and $10^{19}cm^3$, respectively, being preferred. Doping of all the layers can vary by wide ranges depending upon the way in which the laser material is used. For example, if the laser is to be used for coupling light out normal to the plane of the p-n junction then layer 12 might be more lightly doped in order to reduce absorption losses.

We claim:

1. A method of making a diode laser comprising the steps of:

forming an initial rectifying junction along the surface of a body of substrate semiconductor material of one conductivity type, removing a portion of said substrate material, said portion extending from said surface to beyond said rectifying junction whereby a channel is provided that divides said rectifying junction into two separate portions, filling said channel with semiconductor material of said one conductivity type, and subsequently providing another rectifying junction between layers of semiconductor material, said channel defining the path of pump current flowing across said another rectifying junction when said another rectifying junction is forward biased.

2. A method of making a diode laser having a junction for the injection of minority carriers comprising the steps of:

forming in a substrate of semiconductor material of one conductivity type a surface layer of the other conductivity type whereby a rectifying junction is provided in said substrate, removing a portion of said substrate, said portion extending from said surface and through said rectifying junction whereby a channel is provided that extends from said surface to beyond said rectifying junction whereby said rectifying junction is divided into separate rectifying junction portions, and forming upon said substrate surface having said channel a plurality of layers of semiconductor material, at least some of said layers being of materials having different refractive indices and different conductivity types to provide at least one additional rectifying junction between two layers of different conductivity types, said separate rectifying junction portions limiting the travel of pump current to said additional rectifying junction when said additional junction is forward biased to a path through said channel.

* * * * *